United States Patent
Chen et al.

(10) Patent No.: US 10,624,230 B2
(45) Date of Patent: Apr. 14, 2020

(54) ANTI-EARTHQUAKE SERVER RACK

(71) Applicant: QUANTA COMPUTER INC., Taoyuan (TW)

(72) Inventors: Chao-Jung Chen, Taoyuan (TW); Chih-Ming Chen, Taoyuan (TW); Wen-Lung Liao, Taoyuan (TW); Ta-Chih Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/944,167

(22) Filed: Apr. 3, 2018

(65) Prior Publication Data

US 2019/0159358 A1    May 23, 2019

Related U.S. Application Data

(60) Provisional application No. 62/588,553, filed on Nov. 20, 2017.

(51) Int. Cl.
  *H05K 7/20* (2006.01)
  *H05K 7/14* (2006.01)
  *H05K 7/18* (2006.01)

(52) U.S. Cl.
  CPC ......... *H05K 7/1495* (2013.01); *H05K 7/1489* (2013.01); *H05K 7/18* (2013.01)

(58) Field of Classification Search
  CPC ................... H05K 7/1488; H05K 7/20536
  See application file for complete search history.

(56) References Cited

U.S. PATENT DOCUMENTS

| | | | | |
|---|---|---|---|---|
| 4,596,373 A | * | 6/1986 | Omi | ......... F16F 15/02 248/421 |
| 5,816,559 A | * | 10/1998 | Fujimoto | ......... E04H 9/021 248/636 |
| 6,123,313 A | | 9/2000 | Otsuka et al. | |
| 7,409,799 B2 | | 8/2008 | Tsai | |
| 7,716,881 B2 | | 5/2010 | Tsai | |

(Continued)

FOREIGN PATENT DOCUMENTS

| CN | 205577470 U | 9/2016 |
|---|---|---|
| JP | 2006153210 A | 6/2006 |

(Continued)

OTHER PUBLICATIONS

Taiwanese Office Action for Application No. 107117276, dated Sep. 18, 2018, w/ First Office Action Summary.

(Continued)

*Primary Examiner* — Anthony Q Edwards
(74) *Attorney, Agent, or Firm* — Nixon Peabody LLP; Zhou Lu

(57) ABSTRACT

An earthquake protective server rack is provided including an upper server rack frame to house a server and a lower server rack frame. The lower server rack frame combines linear modules that dissipate earthquake energy along the X- and Y-axes and a dampening module that dissipates earthquake energy along a Z-axis. Mechanical movement of the feet on the lower server rack frame permits movement of the protective sever rack on rollers or alternatively to permit full function of the earthquake energy absorbing function while supported by the feet.

8 Claims, 4 Drawing Sheets

(56) References Cited

U.S. PATENT DOCUMENTS

| | | | |
|---|---|---|---|
| 8,240,490 B2* | 8/2012 | Malekmadani | A47B 57/10 211/188 |
| 8,484,911 B2 | 7/2013 | Zayas et al. | |
| 2002/0172013 A1* | 11/2002 | Chandler | H02B 1/301 361/724 |
| 2003/0048603 A1* | 3/2003 | Lee | G11B 33/08 361/679.34 |
| 2004/0262487 A1 | 12/2004 | Kawashima et al. | |
| 2006/0254997 A1* | 11/2006 | Pellegrino | A47B 47/021 211/195 |
| 2007/0119794 A1* | 5/2007 | Hidaka | H05K 7/1495 211/26 |
| 2008/0218970 A1* | 9/2008 | Kehret | H05K 7/1434 361/699 |
| 2011/0222800 A1* | 9/2011 | Hubbard | F16M 13/02 384/36 |
| 2011/0278250 A1* | 11/2011 | Malekmadani | A47B 57/10 211/134 |
| 2018/0223541 A1* | 8/2018 | Kobayashi | G06F 1/16 |

FOREIGN PATENT DOCUMENTS

| | | |
|---|---|---|
| JP | 2013070619 A | 4/2013 |
| JP | 2016041964 A | 3/2016 |
| KR | 100919926 B1 | 10/2009 |
| TW | I373896 B | 10/2012 |

OTHER PUBLICATIONS

Taiwanese Search Report for Application No. 107117276, dated Sep. 18, 2018 w/ First Office Action.

Extended European Search Report for EP Application No. 18183198.3, dated Mar. 19, 2019.

JP Office Action for Application No. 2018-155164, dated Jun. 18, 2019, w/ First Office Action Summary.

\* cited by examiner

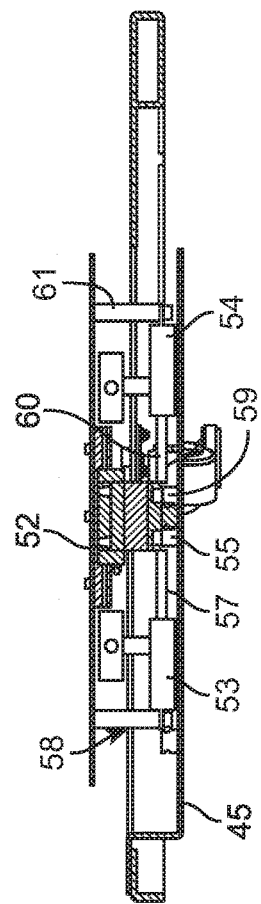
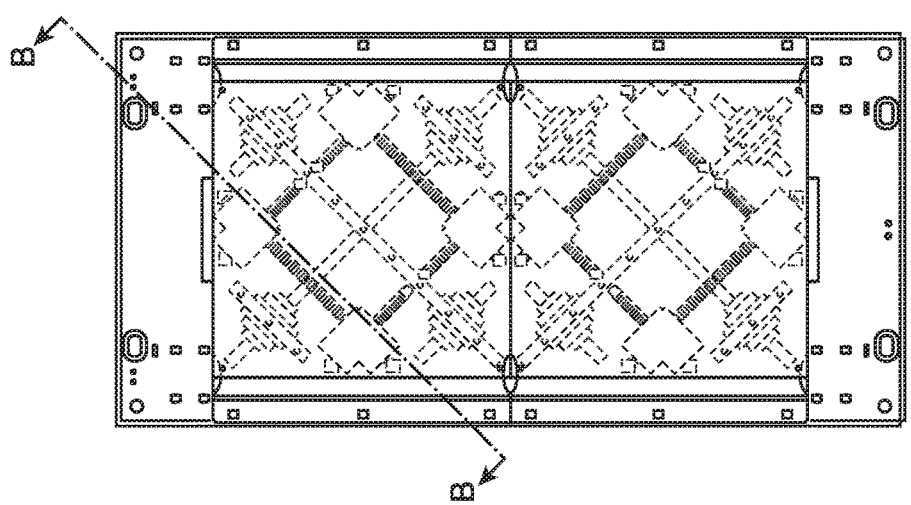

ANTI-EARTHQUAKE SERVER RACK

CROSS-REFERENCE TO RELATED APPLICATIONS

This application claims priority to and the benefit of U.S. Provisional Application No. 62/588,553, entitled "ANTI-EARTHQUAKE RACK DESIGN" and filed Nov. 20, 2017, the contents of which are hereby incorporated by reference in their entirety as if fully set forth herein.

TECHNICAL FIELD

A rack for holding and retaining servers in a protected state even when the rack is subjected to vibrations and movement from earthquakes, after-shocks and similar seismic events. The rack comprises two portions, an upper cabinet into which can be installer the server(s) and a bottom portion of the rack which comprises an anti-earthquake module.

BACKGROUND

An earthquake is what happens when two blocks of the earth suddenly slip past one another. Sometimes an earthquake has foreshocks, which are smaller earthquakes that happen in the same place as the larger earthquake that follows. The largest, or main earthquake is called the mainshock. Mainshocks always have aftershocks that follow. All of these seismic events are hereinafter referred to as earthquakes, whether technically classified as foreshocks, mainshocks or after-shocks.

Data centers are increasing rapidly throughout the world to support the increasing use of servers in many different forms of electronic commerce, from the buying and selling of securities, insurance, selling and delivery of manufactured goods, produce and other foodstuffs, telecommunications and other forms of electronic commerce. In order to facilitate this explosion in the number of servers supporting this electronic commerce, data centers are being built in geographic areas known to have been the setting for earthquakes. Inside these data centers, the numerous servers are contained in cabinets or "racks" that hold multiple servers in proximity one above the other. These servers usually rest upon the floor of the data centers, where the floor comprises a base floor usually made of cast concrete, or an upper floor of the data center formed of precast concrete, wood, or composites of metal and concrete. When subjected to an earthquake, all the floors of a data center can be vibrated, lifted, undulated or otherwise subject to a shift in position, notwithstanding that the floors are formed of a relatively rigid and non-compressible material, such as concrete.

The server cabinets or racks are likewise subjected to vibration, movement and a shift in position when occupying a position on the data center floors. The servers contained within these cabinets or racks are likewise subject to vibration, shifting and displacement from the racks due to a combination of inertia and the shocks of the earthquake.

Heretofore, there was no manner of protecting the server cabinet or racks from the effects of an earthquake or reducing damage to servers contained with the rack. Existing rack designs do not reduce the effect of an earthquake on the servers.

It is from this environment, that the present inventors conceived of this disclosure and protected server cabinets or racks, and the servers contained therein, from the effects of earthquakes.

SUMMARY

In one embodiment of this disclosure is provided a server cabinet or rack comprising at least an upper rack frame to house a plurality of servers therein and a lower rack frame. The lower rack frame comprises linear modules, as well as spring and damper modules, which permit the upper rack frame to have relative displacement in relation to the lower rack frame.

In another embodiment is provided a method of protecting a plurality of servers from the effects of an earthquake by providing a server cabinet comprising at least an upper rack frame in which to house a plurality of servers in a stacked relationship with one another. The upper rack frame is permitted to have relative displacement with regard to a lower rack frame which is constructed so as to have linear displaceable portions as well as spring and damper portions, such that the upper rack frame can move with regard to the lower rack frame.

In a further embodiment, the upper rack frame, and the servers contained therein can experience a relative displacement with relation to a lower rack frame. The lower rack frame absorbs seismic energy through the provision of linear guides, springs and a damper section that protects the servers contained in the upper rack frame.

These and other embodiments will now be described in relation to the appended drawings and a detailed description of the preferred embodiments.

BRIEF DESCRIPTION OF THE DRAWINGS

FIG. 5A is a schematic, perspective view of a cushion module of a lower rack frame.

FIG. 5B is a schematic, cross-sectional view along lines B-B of FIG. 5A.

DETAILED DESCRIPTION

Figure 1:
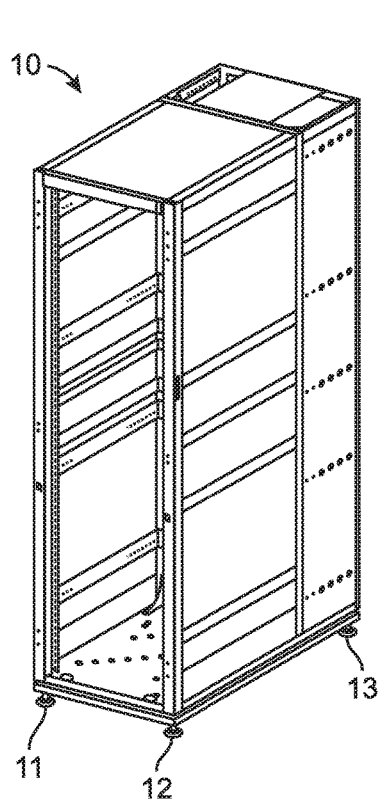
FIG. 1 is a prior art depiction of an existing server cabinet.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As shown in FIG. 1 is a schematic representation of a server rack 10 according to the prior art. The server rack 10 has a plurality of feet 11, 12, 13 to support the cabinet on a floor of the data center. A plurality of servers (not shown) can be placed in server rack 10, and positioned one above the other such that server rack 10 will house a plurality of servers.

Figure 2:
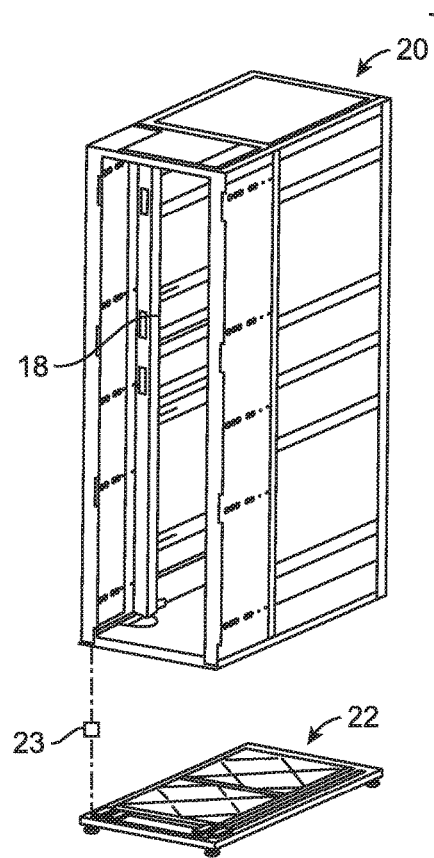
FIG. 2 is a schematic, perspective view of an upper rack frame and a lower rack frame according to a disclosed embodiment.

As shown in FIG. 2 is an upper rack frame 20 and a lower rack frame 22 according to an embodiment of the invention. Similar to server rack 10, upper rack frame 20 includes a housing 18 which can house a plurality of servers (not shown) within the upper rack frame 20. However, unlike server rack 10, upper rack frame 20 is mounted upon lower rack frame 22. A locking element 23 (FIG. 2) may be used to lock upper frame rack 20 to lower frame rack 22 to prevent disassociation of the upper frame rack 20 and lower frame rack 22. Element 23 can take many forms, such as a nut and bolt, a rivet, a C-clamp or any mechanical element sufficient to prevent upper frame rack 20 from being disassociated from lower frame rack 22. It should be understood that while we have illustrated only one locking element 23, this locking element may be replicated any number of times to prevent disassociation of the upper and lower frame racks.

Figure 3A:
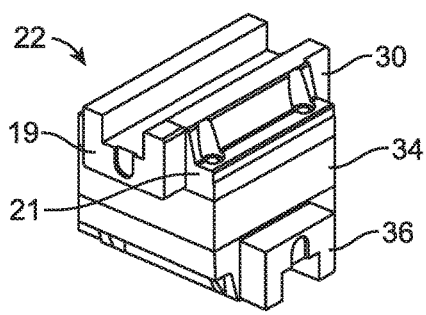
FIG. 3A is an enlarged, partially sectioned, schematic perspective view of an earthquake damper module portion of a lower rack frame of FIG. 3B.

Lower rack frame 22 is an anti-earthquake module than can perform several functions to absorb the shock, vibrations and displacement normally associated with earthquakes. In one aspect, the lower rack frame 22 is formed with linear modules 30 (as discussed in further detail below with respect to FIG. 3A) for movement in an Y-axis, linear modules 36, for movement in an X-axis and interconnected by a dampening layer 34 for Z-axis movement. The dampening layer 34 can be formed of a suitable elastomeric material, such as natural or synthetic rubbers, tough polymers including high-impact polystyrene (HIPS) which is a polymer blend of styrene and butadiene, or composite materials. Linear modules 30 and 36 may be formed of a suitable metal, such as steel, aluminum, or alloys of each, engineering plastics, such as acrylonitrile butadiene styrene (ABS), polycarbonates, polyetherketones, polyimides, polytetrafluoroethylene, polyethylene terephthalate, polyphenylene sulfide, polyphenylene oxide, polysulphones and polyamides, including fiber and/or fabric reinforced versions of the same, and composites of metals and plastics. The linear modules 30 and 36 are preferably formed as a relatively slideable guide rail 19 and carriage 21. The slideability between the guide rail 19 and carriage 21 may be increased by the use of a chemical agent, such as an oil, grease or other liquid lubricant, or with a coating of an anti-stick agent, such as polytetrafluoroethylene. Alternatively, mechanical devices, such as ball bearings, slide bearings or linear bearings can be employed to facilitate the relative displacement in the linear modules. While we have illustrated the linear modules 30 and 36 being formed as relatively slideable guide rail and carriage structures, it is readily apparent that other mechanical displacement elements can be substituted to achieve relative displacement in the X- and Y-axes. The dampening layer 34 can be chemically or mechanically bonded to carriage 21.

Figure 3B:
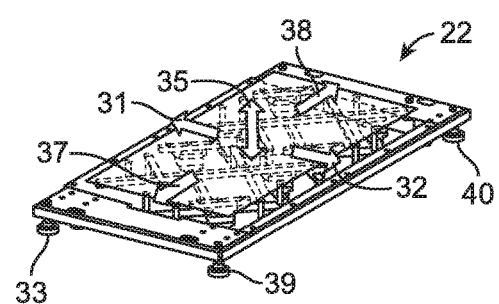

As shown in FIG. 3B, the arrows 31, 32, show movement in the X-axis, the arrows 37, 38 illustrate movement in the Y-axis and the arrow 35 illustrates movement in the Z-axis. Lower rack frame 22 may be provided with a plurality of feet 33, 39 and 40 which are in contact with the floor of the data center. However, an improved support apparatus for the anti-earthquake rack frame of the disclosure is shown in FIGS. 7A and 7B.

Figure 7A:
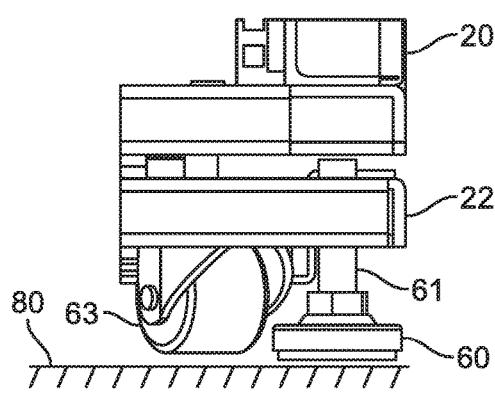
FIG. 7A is a schematic enlarged view of a foot portion permitting release between upper and lower rack frame so that anti-earthquake function can be effected.
Figure 7B:
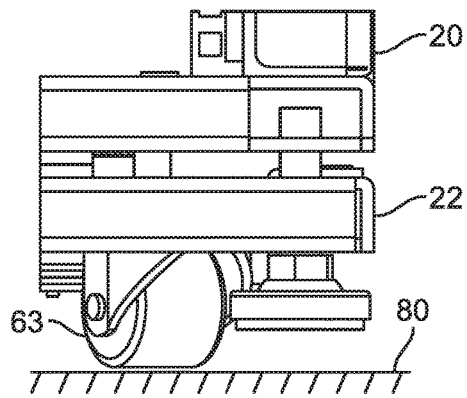
FIG. 7B is a schematic enlarged view of a foot portion in locked position between upper and lower rack frame so that server cabinet can be moved.

As shown in FIG. 7A, a foot 60 is provided on a moveable shaft 61. The moveable shaft 61 is always in contact with lower rack frame 22 as shown in FIG. 7A, but can be moved so as to also engage upper rack frame 20 as shown in FIG. 7B, while at the same time lifting foot 60 out of contact with floor 80 of the data center. When engaged with upper rack frame 20, the engagement shifts the support of upper rack frame 20 to roller 63 and permits the lower rack frame 22 and upper rack frame 20 to be moved as a unit on roller 63. When disengaged from contact with upper frame rack 20, the moveable shaft 61 and foot 60 engage floor 80 of the data center and only support lower rack frame 22 and all anti-earthquake functionality of lower rack frame 22 is assured. Although only one foot 60 is shown, it is to be understood that a plurality of feet 60 may be provided as well as a plurality of rollers 63. Each foot 60 can be raised or lowered by a mechanical mechanism, such as a lever (not shown). The foot 60 and roller 63 can be placed in proximity as shown near the corners of the lower rack frame. Alternatively, the foot 60 and roller 63 do not have to be in proximity, but could be spaced from one another. Although the number of foot 60 and roller 63 will generally be provided as 4 units each, the provision of a lesser or greater number of each foot 60 and each roller 63 will not add to or detract from the invention.

Figure 4B:
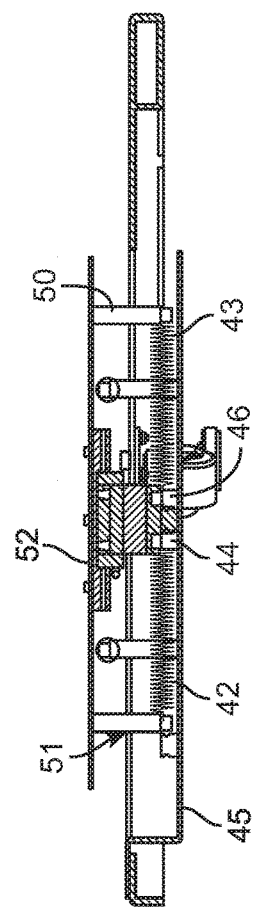
FIG. 4B is a schematic, cross-sectional view along lines A-A of FIG. 4A.
Figure 4A:
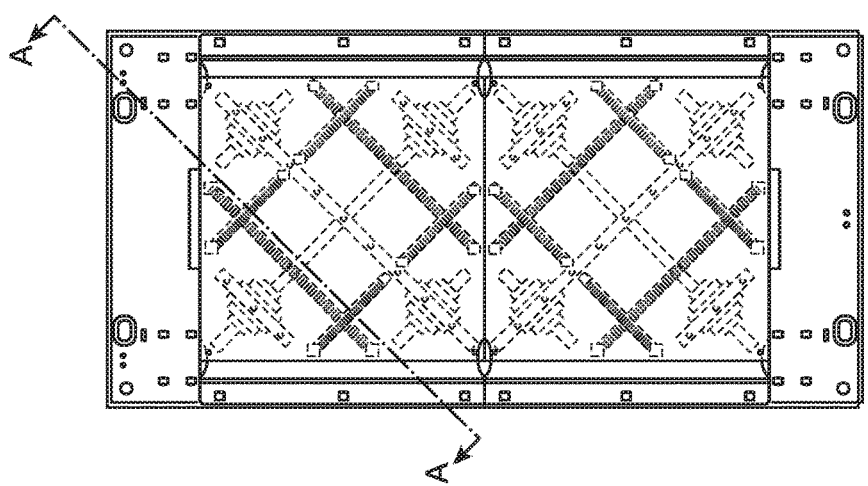
FIG. 4A is a schematic, perspective view of a spring module of a lower rack frame.

Alternatives to the use of the dampening layer r 34 can be found in FIGS. 4A and 4B. A single spring 42, or plurality of springs 42, 43 can be used in lieu of the dampening layer 34 to provide a dampening module layer based on mechanical spring elements rather than the elastomeric material of the dampening layer 34. The number, positioning and placement of spring(s) 42, 43 can be selected to provide suitable dampening effect between upper plate 52 and bottom plate 45 as shown in FIG. 4B, while at the same time supporting the mass of the upper rack 20 and the servers (not shown) contained therein. Each of the spring(s) 42, 43 extends substantially horizontally, with one end of the spring 42 anchored to a short post 44, wherein short post 44 is attached to bottom plate 45. The other end of the spring 42 is anchored to long post 51, wherein long post 51 extends downwardly from, and is attached to upper plate 52. Similarly, spring 43 is attached at one end to short post 46, wherein short post 46 is also attached to bottom plate 45. The other end of spring 43 is attached to long post 50, wherein long post 50 is attached to upper plate 52. The number of spring(s) 42, 43, short posts 44, 46 and long posts 50, 51 can be duplicated as desired in order to provide the necessary energy absorbing effect in permitting upper plate 52 and bottom plate 45 to be relatively displaceable, but still dampened by the effect of the spring(s) 42, 43. When multiple springs are used, the spring(s) 42, 43 are arranged at a bias to a longitudinal axis of bottom plate 45 so as to permit displacement in the X- and Y-axes.

Another alternative to the use of dampening layer 34 can be found in FIG. 5A and FIG. 5B. In this alternative, cushions are used in lieu of dampening layer 34. Cushions 53, 54 are shown in FIG. 5B and are arranged substantially horizontally between upper plate 52 and bottom plate 45 to present a cushion dampening effect between the upper plate 52 and bottom plate 45 in lieu of the dampening layer 34. Cushion 53 is attached at one end to short post 55 by the use of a rod 57. Short post 55 is attached to bottom plate 45. The other end of cushion 53 is attached to standoff link 58, which standoff link 58 is attached to upper plate 52. Similarly, cushion 54 is attached at one end to short post 59 by the use of rod 60. Short post 55 is attached to bottom plate 45. The other end of cushion 54 is attached to the moveable shaft 61. The moveable shaft 61 is attached to upper plate 52. Other repetitions of the cushions 53, 54 can also be used if placed so as to effect the relative movements in the X and Y axes of upper plate 52. The advantage of the cushions 53, 54 over the dampening layer 34 or spring(s) 42, 43 is that the individual cushions 53, 54 (and any other repetitions or duplicates thereof) can be selected to specifically accommodate the specific mass of upper rack frame 20 and the specific servers (not shown) contained therein to optimize the anti-earthquake effect for the mass of each server rack unit, rather than relying upon an average weight of the servers to be contained therein.

Figure 6A:
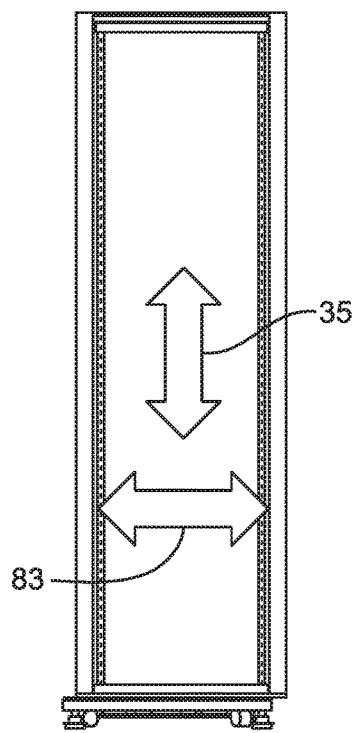
FIG. 6A is a schematic, front view of upper and lower rack frames according to an embodiment of the disclosure with the arrows indicating relative displacement.
Figure 6B:
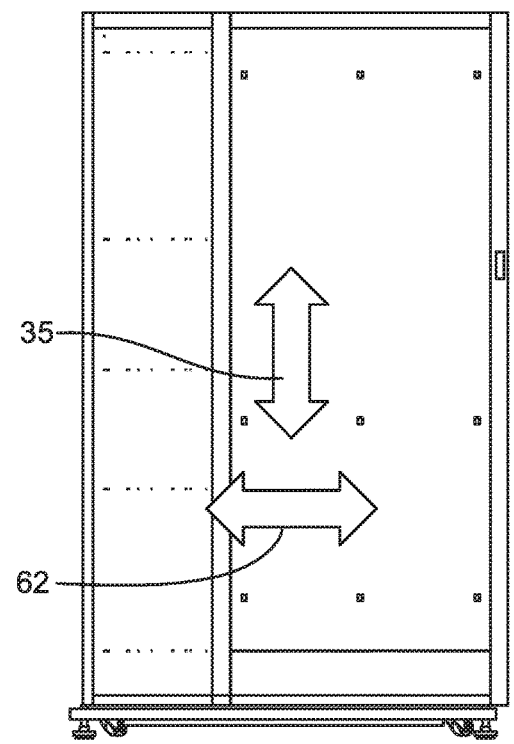
FIG. 6B is a schematic, side view of upper and lower rack frames according to an embodiment of the disclosure with the arrows indicating relative displacement.

Notwithstanding whether the dampening layer 34, the springs 42, 43 or the cushions 53, 54 is chosen, each combination of the lower rack frame 22 and upper rack frame 20 will provide X- and Z-axis protection as shown by the arrows 83 and (35 in FIG. 6A and Y- and Z-axis protection as shown by arrows 62 and 35 in FIG. 6B.

It is to be understood that the various embodiments described herein are exemplary only, and not limiting, as those skilled in the art to which this application is directed, will, upon reading this disclosure, envision other modifications and embodiments to implement the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. An earthquake protective server rack, for housing servers, said server rack comprising:
   an upper server rack frame; the upper server rack frame comprising a housing for at least one server;
   a lower server rack frame, the lower server rack frame comprising at least two linear modules that permit movement along two perpendicular axes; wherein said lower rack frame further comprises rollers and feet for contact with a floor;
   a dampening layer, said dampening layer being situate between said at least two linear modules:
   wherein the feet are relatively moveable with regard to the upper frame rack whereby upper movement of the feet relatively locks the upper server frame to the lower server frame.

2. The earthquake protective server rack of claim 1, wherein the dampening layer comprises an elastomeric material.

3. The earthquake protective server rack of claim 1, wherein the dampening layer comprises a spring.

4. The earthquake protective server rack of claim 1, wherein the dampening layer comprises an inflatable bladder.

5. The earthquake protective server rack of claim 1, wherein the feet are relatively moveable with regard to the upper frame rack whereby upper movement of the feet permits the lower rack frame to be supported solely on the rollers.

6. The earthquake protective server rack of claim 1, wherein the linear modules each comprise a respective guide rail and carriage structure.

7. The earthquake protective server rack of claim 1, wherein the two perpendicular axes comprise an X- and a Y-axis; wherein one of the at least two linear modules provides for relative movement along an X-axis, and another of the at least two linear modules provides for displacement along the Y-axis.

8. The earthquake protective server rack of claim 1, wherein the dampening module dissipates the energy of an earthquake along the Z-axis, wherein the Z-axis is perpendicular to each of the X- and Y-axes.

* * * * *